US010156798B2

(12) United States Patent
Ohashi

(10) Patent No.: US 10,156,798 B2
(45) Date of Patent: Dec. 18, 2018

(54) SUBSTRATE PROCESSING APPARATUS

(71) Applicant: HITACHI KOKUSAI ELECTRIC INC., Tokyo (JP)

(72) Inventor: Naofumi Ohashi, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/701,977

(22) Filed: Sep. 12, 2017

(65) Prior Publication Data
US 2018/0164702 A1   Jun. 14, 2018

(30) Foreign Application Priority Data

Dec. 13, 2016   (JP) .................................. 2016-241145

(51) Int. Cl.
| | |
|---|---|
| *G03F 7/20* | (2006.01) |
| *G03F 7/00* | (2006.01) |
| *C23C 16/46* | (2006.01) |
| *H01L 21/027* | (2006.01) |
| *C23C 16/34* | (2006.01) |
| *C23C 16/452* | (2006.01) |
| *C23C 16/458* | (2006.01) |
| *C23C 16/50* | (2006.01) |

(52) U.S. Cl.
CPC .......... *G03F 7/70866* (2013.01); *C23C 16/34* (2013.01); *C23C 16/452* (2013.01); *C23C 16/4586* (2013.01); *C23C 16/46* (2013.01); *G03F 7/00* (2013.01); *G03F 7/0002* (2013.01); *G03F 7/20* (2013.01); *H01L 21/027* (2013.01); *C23C 16/50* (2013.01)

(58) Field of Classification Search
CPC ............. G03F 7/70558; G03F 7/70625; G03F 7/70866; H01L 21/67115; H01L 21/67196
USPC .............................. 438/706, 795; 355/27, 30
See application file for complete search history.

(56) References Cited

U.S. PATENT DOCUMENTS

| | | | |
|---|---|---|---|
| 6,449,844 B2 * | 9/2002 | Duddy | ................ C23C 16/4585 29/890.03 |
| 7,615,259 B2 | 11/2009 | Nishikawa | |
| 8,287,967 B2 | 10/2012 | Nishikawa | |

(Continued)

FOREIGN PATENT DOCUMENTS

| | | |
|---|---|---|
| JP | 2000-034568 A | 2/2000 |
| JP | 2001-102435 A | 4/2001 |

(Continued)

OTHER PUBLICATIONS

Japanese Office Action dated Sep. 20, 2018 for the Japanese Patent Application No. 2016-241145.

*Primary Examiner* — Hung Nguyen
(74) *Attorney, Agent, or Firm* — Volpe and Koenig, P.C.

(57) ABSTRACT

Described herein is a technique capable of suppressing a generation of particles. A substrate processing apparatus may include: a substrate support including: a protruding portion supporting a substrate including a pattern region at a center thereof and a non-contacting region at a periphery thereof; and a bottom portion defining a space along with the protruding portion; a process chamber wherein the substrate support is provided and the substrate is processed; a process gas supply unit configured to supply a process gas into the process chamber; and a hot gas supply unit configured to heat and supply an inert gas into the space.

12 Claims, 9 Drawing Sheets

(56) References Cited

U.S. PATENT DOCUMENTS

| | | | |
|---|---|---|---|
| 9,425,039 B2 | 8/2016 | Harada et al. | |
| 2015/0147894 A1* | 5/2015 | Hamano | H01L 21/67115 |
| | | | 438/795 |
| 2016/0079101 A1* | 3/2016 | Yanai | H01L 21/67103 |
| | | | 438/706 |

FOREIGN PATENT DOCUMENTS

| | | |
|---|---|---|
| JP | 2010-219274 A | 9/2010 |
| JP | 2013-235885 A | 11/2013 |
| JP | 2015-185825 A | 10/2015 |
| JP | 2016-063033 A | 4/2016 |
| WO | 02/065532 A1 | 8/2002 |

\* cited by examiner

SUBSTRATE PROCESSING APPARATUS

CROSS-REFERENCE TO RELATED PATENT APPLICATION

This U.S. non-provisional patent application claims priority under 35 U.S.C. § 119 of Japanese Patent Application No. 2016-241145, filed on Dec. 13, 2016, in the Japanese Patent Office, the entire contents of which are hereby incorporated by reference.

BACKGROUND

1. Field

The present disclosure relates to a substrate processing apparatus.

2. Description of the Related Art

An exemplary substrate processing apparatus for processing a substrate includes a substrate support for supporting the substrate in the process chamber.

The substrate processing apparatus is capable of processing various types of substrates. One of the various types of substrates is a glass substrate used as a lithography template for nanoimprint. The lithography template is transcribed onto a resin on a substrate to form a pattern on the substrate.

In order to transcribe the lithography template onto the substrate through the nanoimprint process, the lithography template should have high accuracy. In order to produce a lithography template with high accuracy, a substrate processing such as a formation of a hard mask on the lithography template is necessary. When the hard mask is formed, for example, a process such as heating the substrate is performed.

It is necessary to suppress the generation of particles during the nanoimprint process. If particles are attached to the lithography template, the lithography template is not transcribed to the substrate as desired. As a result, the yield of the substrate is significantly reduced.

SUMMARY

Described herein is a technique capable of suppressing a generation of particles.

According to one aspect of the technique described herein, a substrate processing apparatus may include: a substrate support including: a protruding portion supporting a substrate including a pattern region at a center thereof and a non-contacting region at a periphery thereof; and a bottom portion defining a space along with the protruding portion; a process chamber wherein the substrate support is provided and the substrate is processed; a process gas supply unit configured to supply a process gas into the process chamber; and a hot gas supply unit configured to heat and supply an inert gas into the space.

DETAILED DESCRIPTION

Hereinafter, embodiments will be described with reference to the FIGS. 1A through 9.

First Embodiment

A substrate processing apparatus according to the first embodiment will be described.

Hereinafter, the first embodiment will be described with reference to the FIGS. 1A through 6.

Substrate Processing Apparatus

Figure 1A:
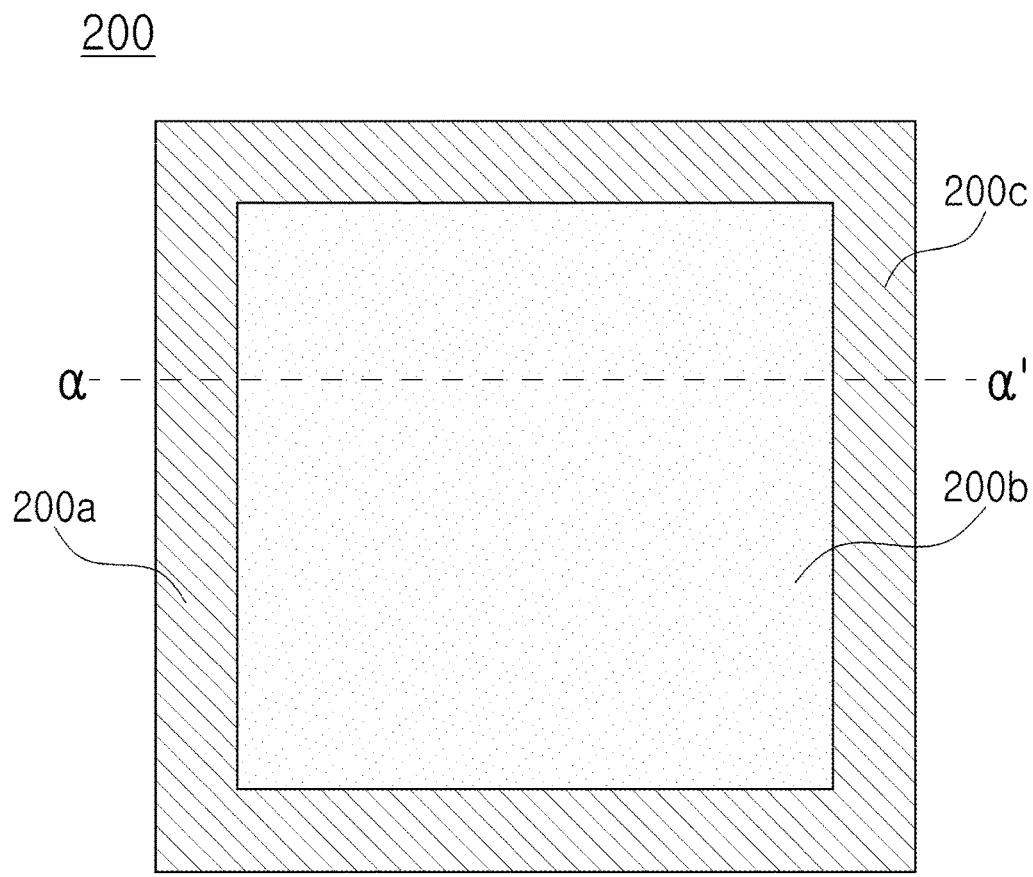
FIGS. 1A and 1B schematically illustrate a substrate to be processed by a substrate processing apparatus according to a first embodiment described herein.
Figure 1B:
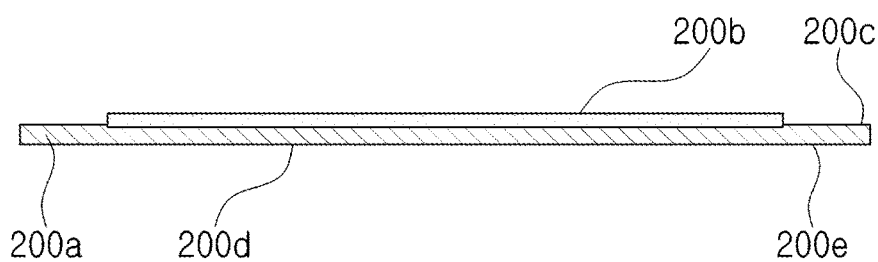

First, a substrate 200 to be processed will be described with reference to FIGS. 1A and 1B. FIG. 1A is a plan view of the substrate 200, and FIG. 1B is a cross-sectional view taken along the line α-α' of FIG. 1A. The substrate 200 is used as a lithography template for nanoimprint. Hereinafter, the lithography template for nanoimprint is also referred to as "L-template". A pre-formed template called the master template (not shown) is used to form the L-template. The L-template is used as a template for transcribing a pattern onto a substrate. By pressing the L-template onto the substrate, the pattern is transferred onto the substrate.

As described above, the substrate 200 is used as the L-template. The substrate 200 includes a glass substrate 200*a* as a base and a pattern region 200*b* formed on the glass substrate 200*a*. The pattern from the master template is transcribed onto the pattern region 200*b*. The pattern region 200*b* is convex such that the substrate 200 (L-template) is not in contact with a portion other than the portion of the substrate onto which the pattern is transcribed when the substrate (L-template) 200 is pressed onto the substrate. Structures such as a hard mask, which will be described later, are transcribed onto the pattern region 200*b*.

A region 200*c* is a region of the front surface of the glass substrate 200*a* other than the pattern region 200*b*. Because the region 200*c* does not come in contact with the substrate onto which the pattern is transcribed, the region 200*c* is also referred to as "non-contacting region 200*c*" in the first embodiment. A back surface 200*d* is the back surface of the pattern region 200*b*. A back surface 200*e* is the back surface of the non-contacting region 200*c*. In the first embodiment, the back surface 200*d* is also referred to as the "central back surface 200d" of the substrate 200 and the back surface 200e is also referred to as the "peripheral back surface 200e" of the substrate 200.

Figure 2:
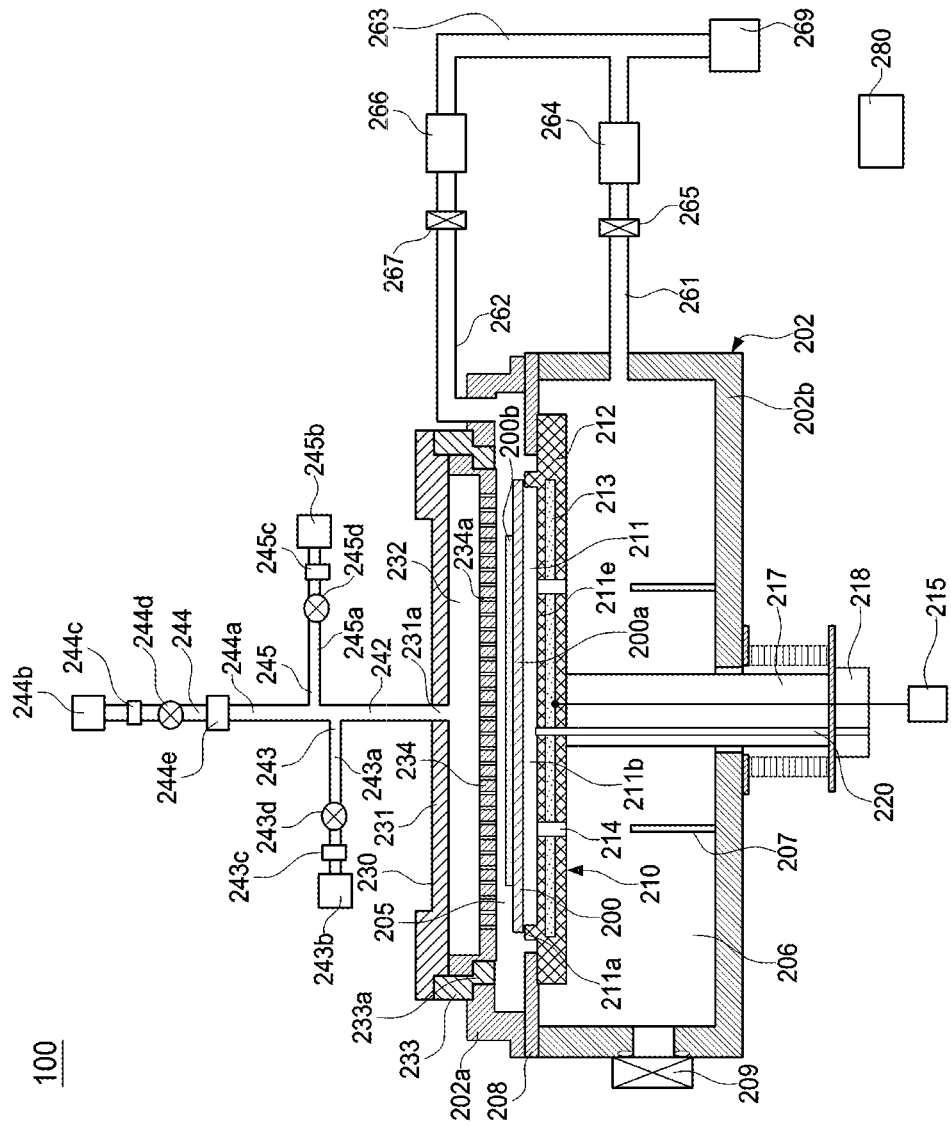
FIG. 2 schematically illustrates a vertical cross-section of the substrate processing apparatus according to the first embodiment.

Next, a substrate processing apparatus 100 for processing the substrate 200 shown in FIGS. 1A and 1B will be described with reference to the FIG. 2. FIG. 2 schematically illustrates a vertical cross-section of the substrate processing apparatus 100 according to the first embodiment.

Vessel

As shown in FIG. 2, the substrate processing apparatus 100 includes a vessel 202. A process space (also referred to as "process chamber") 205 where the substrate 200 is processed and a transfer space 206 where the substrate 200 passes through when the substrate 200 is transferred into the process space 205 are provided in the vessel 202. The vessel 202 includes an upper vessel 202a and a lower vessel 202b. A partition plate 208 is provided between the upper vessel 202a and the lower vessel 202b.

A substrate loading/unloading port is provided on a side surface of the lower vessel 202b adjacent to a gate valve 209. The substrate 200 is moved between a vacuum transfer chamber (not shown) and the transfer space 206 through the substrate loading/unloading port. Lift pins 207 are provided at the bottom of the lower vessel 202b. The lower vessel 202b is electrically grounded.

A substrate support unit 210 is provided in the process space 205 to support the wafer 200. The substrate support unit 210 includes a substrate support 212 having a buffer structure 211, on which the wafer 100 is placed. Preferably, the substrate support unit 210 further includes a heating unit 213 as a heating source provided in the substrate support 212. The heating unit 213 includes a resistance heating element. Through-holes 214 are provided in the substrate support 212 at positions corresponding to the lift pins 207 such that the lift pins 207 penetrate through the through-holes 214. A heater temperature control unit 215 is connected to the heating unit 213. The heater temperature control unit 215 is configured to control a temperature of the heating unit 213 in accordance with an instruction from a controller 280. The heating unit 213 is also referred to as "substrate support heating unit." The buffer structure 211 is defined by a protruding portion 211a and a bottom portion 211e. A space surrounded by the protruding portion 211a is referred to as a space 211b. The space 211b is also referred to as "buffer space." The substrate support 212 will be described later in detail.

The substrate support 212 is supported by a shaft 217. The shaft 217 penetrates the bottom of the vessel 202 and is connected to an elevating mechanism 218 at the outside of the vessel 202. A hot gas supply pipe 220, which will be described later, is provided inside the shaft 217. In the first embodiment, the substrate support 212 is also referred to as the substrate support unit. The substrate support will be described later in detail.

A shower head 230, which is a gas dispersion mechanism, is provided in the upper portion (at the upstream side) of the process space 205. A gas introduction hole 231a is provided in a cover 231 of the shower head 230. The gas introduction hole 231a communicates with a common gas supply pipe 242 which will be described later.

The shower head 230 includes the dispersion plate 234 to disperse gases. The upstream side of the dispersion plate 234 is referred to as a process gas retention space 232. The downstream side of the dispersion plate 234 is referred to as the process space 205. Through-holes 234a are provided at the dispersion plate 234.

The upper vessel 202a includes a flange (not shown). A support block 233 is placed on and fixed to the flange (not shown). The support block 233 includes a flange 233a. The dispersion plate 234 is placed on and fixed to the flange 233a. The cover 231 is fixed to the upper surface of the support block 233.

Substrate Support

Figure 3:
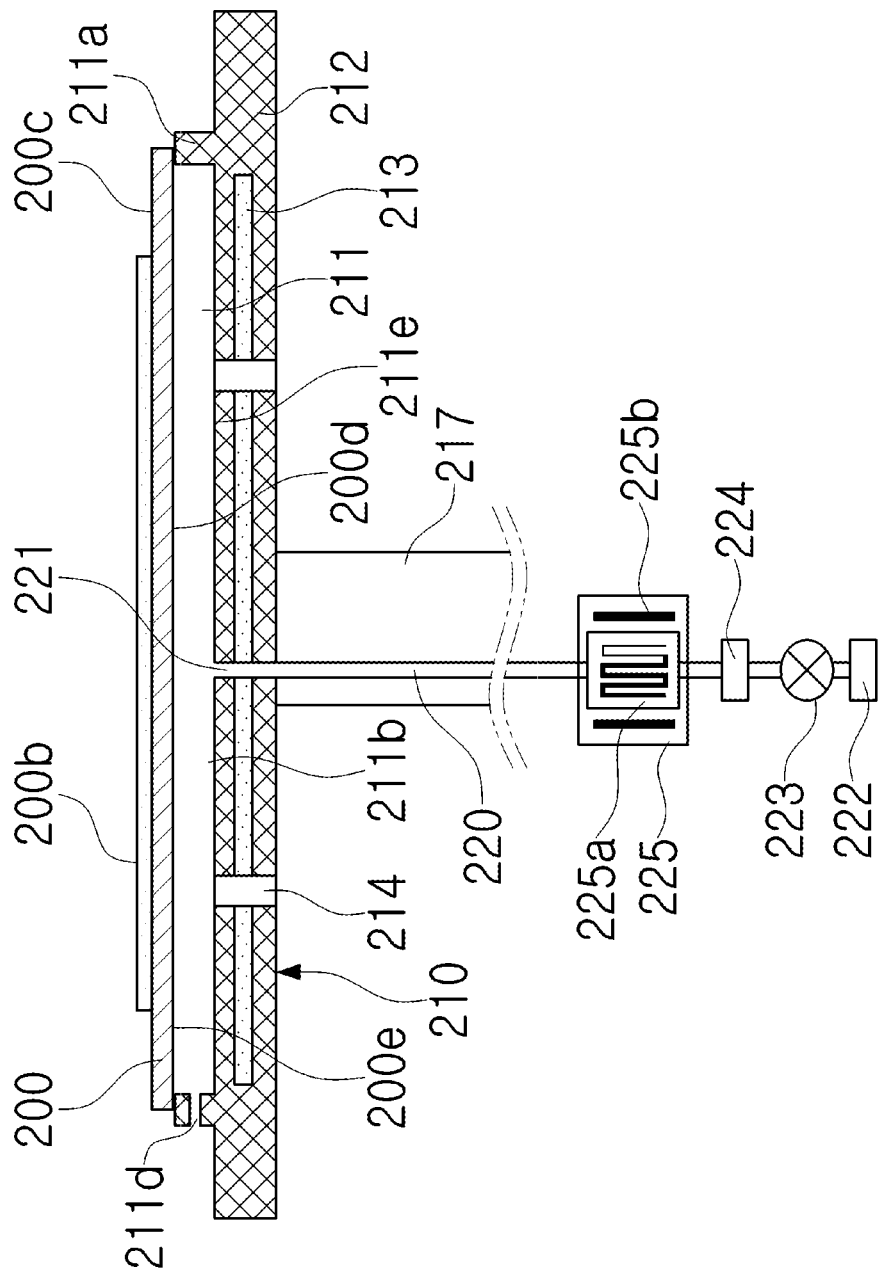
FIG. 3 schematically illustrates a vertical cross-section of a substrate support of the substrate processing apparatus according to the first embodiment.

Next, the structure of the substrate support will be described in detail with reference to FIG. 3. FIG. 3 is an enlarged view of the substrate support 212. As described above, the buffer structure 211 includes the protruding portion 211a. The protruding portion 211a supports the peripheral back surface 200e of the substrate 200 and is, for example, annular. The space 211b is defined by the back surface of the substrate 200 supported by the upper end of the protruding portion 211a, the inner surface of the protruding portion 211a and the surface of the bottom portion 211e of the buffer structure 211.

The contact area between the back surface of the substrate 200 and the substrate support 212 is reduced by the space 211b when the substrate 200 is supported by the protruding portion 211a. Therefore, generation of particles due to contact may be suppressed.

The size of the protruding portion 211a is set such that the space 211b is provided about the central back surface 200d of the pattern region 200b and the peripheral back surface 200e of the non-contacting region 200c is supported. That is, there is no structure supporting the central back surface 200d of the substrate 200.

Holes 211d provided in a portion of the protruding portion 211a are open toward the side surface. The holes 211d penetrate the protruding portion 211a and are provided at a predetermined interval. The space 211b communicates with the space outside the protruding portion 211a, that is, the process space 205 through the holes 211d. The first embodiment is described based on the structure wherein the holes 211d are provided in the protruding portion 211a. However, the holes 211d may be provided below the peripheral back surface 200e of the substrate 200. Alternately, the holes 211d may be provided, for example, at the bottom portion 211e if structurally feasible.

A hot gas supply port 221 is provided at the bottom portion 211e. The hot gas supply port 211 is provided at one end of the hot gas supply pipe 220. A hot gas source 222 is connected to the other end of the hot gas supply pipe 220. The gas supplied from the hot gas source 222 may be an inert gas. The inert gas is heated by a gas heating unit 225, which will be described below. Hereinafter, the heated inert gas may be also referred to as "hot gas."

A valve 223, a mass flow controller (MFC) 224 and the gas heating unit 225 are installed at the hot gas supply pipe 220 in order from the upstream side to the downstream side of the hot gas supply pipe 220 between the hot gas source 222 and the hot gas supply port 221. The valve 223 and the mass flow controller (MFC) 224 adjust a flow rate of the inert gas supplied from the hot gas source 222. The gas heating unit 225 heats the inert gas outputted from the hot gas source 222. The gas heating unit 225 at least includes a labyrinth structure 225a and a gas heating element 225b disposed in the peripheral portion of the labyrinth structure 225a. As a gas heating element, for example, a resistance heating element is used. The inert gas passing through the gas heating unit 225 is heated by the gas heating element 225b while passing through the labyrinth structure 225a. As a result, the inert gas is heated to a desired temperature.

The inert gas is supplied to the space 211b via the valve 223, the mass flow controller 224 and the gas heating unit 225. The hot gas supplied to the space 211b heats the back surfaces 200d and 200e of the substrate 200 by the convection and then exhausted through the holes 211d.

In the first embodiment, the gas heating unit 225, mass flow controller 224 and valve 233 are collectively referred to as a hot gas supply unit. The hot gas supply unit may further include a hot gas source 222.

Figure 9:
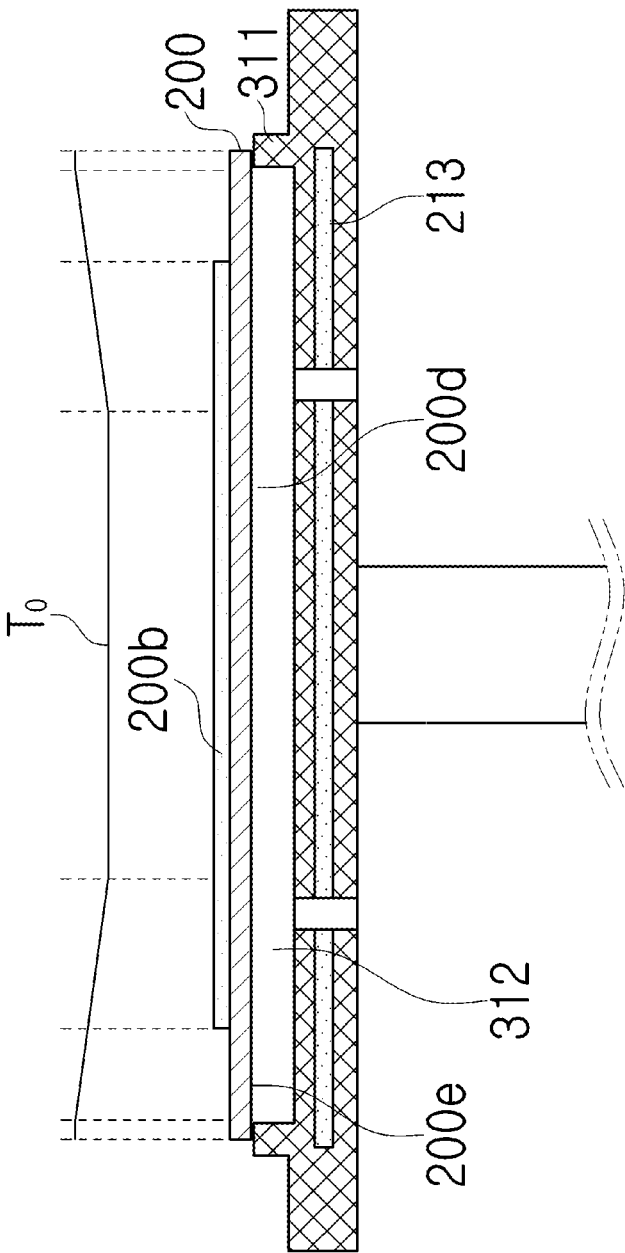
FIG. 9 schematically illustrates a vertical cross-section of a substrate support according to a comparative example.

The reason for heating the back surface 200e via the space 211b according to the first embodiment will be explained with reference to a comparative example. FIG. 9 illustrates the comparative example. As shown in FIG. 9, the structure according to the comparative example does not include the hot gas supply pipe 220 but only includes a protruding portion 311. $T_0$ represents the temperature distribution at the surface of the substrate 200. As shown in FIG. 9, the peripheral portion (peripheral back surface 200e) of the substrate 200 is heated by the heat from the heating unit 213 conducted through the contact portion between the protruding portion 311 and the substrate 200. Since the center portion (central back surface 200d) of the substrate 200 is spaced apart from the protruding portion 311, the efficiency of heating the center portion of the substrate 200 by thermal conductivity is lower than that of heating the peripheral portion of the substrate 200 by the thermal conductivity. When the substrate 200 is processed, the process space 205 is in vacuum state. Therefore, the space 312 is also in vacuum state. As a result, convection does not occur in the space 312, and the temperature of the center portion of the substrate 200 is lower than that of the peripheral portion as in the temperature distribution $T_0$. The same applies to the temperature distribution of the pattern region 200b. That is, the temperature of the center portion of the pattern region 200b is lower than that of the peripheral portion of the pattern region 200b. That is, a temperature difference exists in the substrate 200.

Figure 4:
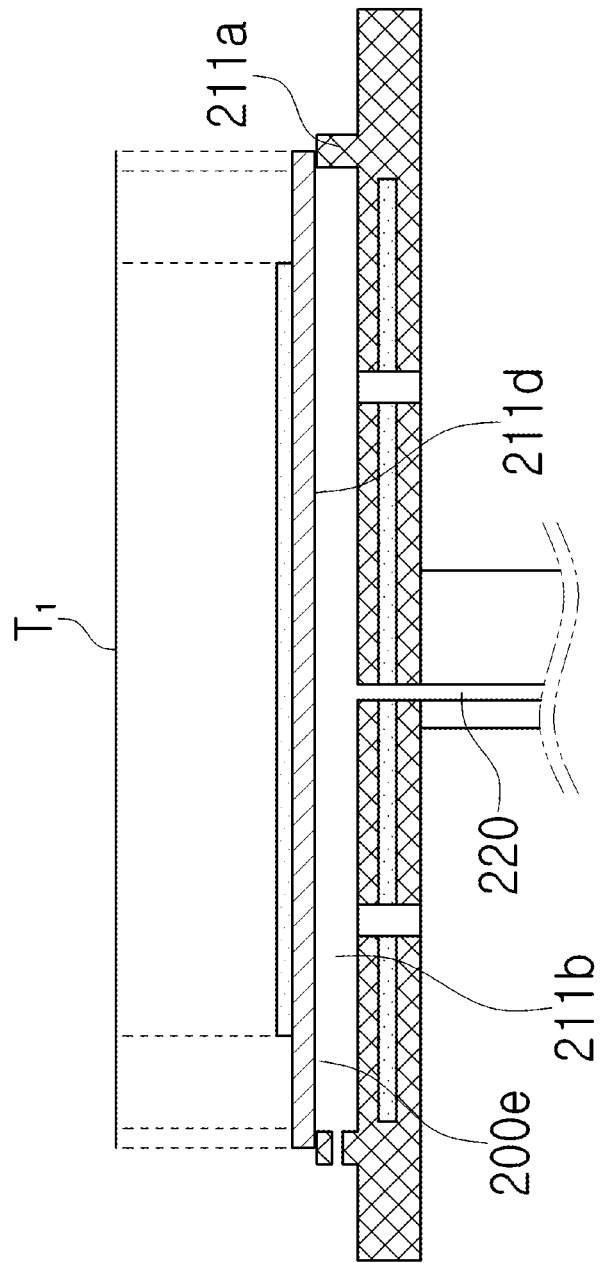
FIG. 4 illustrates a temperature distribution at a surface of the substrate placed on the substrate support of the substrate processing apparatus according to the first embodiment.

On the other hand, according to the first embodiment, as shown in FIG. 4, the hot gas is supplied to the space 211b through the hot gas supply pipe 220. The central back surface 200d of the substrate 200 is heated by the convection of heat from the heating unit 213 and the thermal energy of the hot gas since the space 211b is filled with the hot gas. As a result, the temperature of the back surface of the substrate 200 contacting the gas is uniform. That is, the temperature distribution at the surface of the substrate 200 is substantially flat as in the temperature distribution $T_1$ shown in FIG. 4, and the temperature distribution of the pattern region 200b is thereby also flat. Therefore, the thickness of the film formed in the pattern region 200b is uniform.

Since the space 211b is provided below the peripheral back surface 200e of the substrate 200, the hot gas may heat the peripheral portion of the substrate 200. That is, the hot gas may heat the non-contacting region 200c. Since the back surface 200e as well as the back surface 200d may be heated, the peripheral portion of the pattern region 200b may also be suitably heated. When only the central back surface 200d is heated, the temperature at the boundary between the pattern region 200b and the non-contacting region 200c is lower than the temperature of the center portion of the pattern region 200b. However, according to the first embodiment, the central back surface 200d as well as the peripheral back surface 200e of the substrate 200 may be heated.

Next, the reason that the holes 211d are provided below the peripheral back surface 200e of the substrate 200 will be explained. As shown in FIG. 3, the substrate support 210 has through-holes 214. As far as the discharge of the hot gas is concerned, the through-holes 214 in the substrate support 210 are sufficient. However, when only the through-holes 214 are provided without the holes 211d below the peripheral back surface 200e of the substrate 200, the hot gas stagnates below the peripheral back surface 200e of the substrate 200. As a result, the peripheral back surface 200e of the substrate 200 is heated more than the central back surface 200d of the substrate 200, thereby increasing the number of parameters for adjusting the temperature of the surface of the substrate 200. Accordingly, the number of processes for controlling (adjusting) the temperature of the surface of the substrate 200 increases. In contrast, according to the first embodiment, the holes 211d provided below the peripheral back surface 200e of the substrate 200 suppresses the retention of the hot gas. As a result, the number of parameters for adjusting the temperature of the surface of the substrate 200 does not increase.

Process Gas Supply Unit

The common gas supply pipe 242 is connected to the cover 231 of the shower head 230 to communicate with the gas introduction hole 231a provided in the cover 231. A first gas supply pipe 243a, a second gas supply pipe 244a and a third gas supply pipe 245a are connected to the common gas supply pipe 242. In the first embodiment, the gases supplied through the first gas supply pipe 243a, the second gas supply pipe 244a and the third gas supply pipe 245a are referred to as process gases.

First Gas Supply System

A first gas source 243b, a mass flow controller (MFC) 243c serving as a flow rate controller (flow rate control unit) and a valve 243d serving as an opening/closing valve are installed in order at the first gas supply pipe 243a.

The first gas source 243b is the source of a first gas containing a first element (also referred to as "first element-containing gas"). In the first embodiment, the first element includes, for example, titanium (Ti). That is, the first element-containing gas includes a titanium-containing gas such as $TiCl_4$ gas. The source of the first element-containing gas may be solid, liquid or gas at room temperature and under atmospheric pressure. When the source of the first element-containing gas is liquid at room temperature and under atmospheric pressure, an evaporator (not shown) may be provided between the first gas supply source 242b and the mass flow controller 243c. In the first embodiment, the source of the first element-containing gas is a gas.

The first gas supply system 243 (also referred to as titanium-containing gas supply system) is constituted by the first gas supply pipe 243a, the MFC 243c and the valve 243d.

Second Gas Supply System

A second gas source 243b, a mass flow controller (MFC) 244c serving as a flow rate controller (flow rate control unit), a valve 244d serving as an opening/closing valve and a remote plasma unit 244e are installed in order at the second gas supply pipe 244a.

A gas containing a second element (hereinafter referred to as second element-containing gas) is supplied into the shower head 230 via the mass flow controller 244c, the valve 244d and the remote plasma unit 244e provided in the second gas supply pipe 244a. The second element-containing gas is supplied onto the substrate 200 in plasma state activated by the remote plasma unit 244e.

The remote plasma unit 244e, which is a plasma generating unit, generates plasma using, for example, an ICP (Inductive Coupling Plasma) method. The remote plasma unit 244e may include components such as a coil (not shown), matching box (not shown) and a power supply (not shown). As described in more detail later, the components of the remote plasma unit 244e such as the power supply and the matching box may be adjusted in advance based on conditions such as gas type and pressure range in order to generate plasma with low ions and high radicals when the second element-containing gas passes through the remote plasma unit 244e.

The second element-containing gas is one of the process gases. In the first embodiment, the second element-containing gas may be a reactive gas or a modifying gas. Therefore, the second gas supply system may be also referred to as a reactive gas supply system. Any component that includes "second gas" in its name such as "second gas supply source", may be referred to as a "source gas supply system".

In the first embodiment, the second element in the second element-containing gas is different from the first element. The second element may include, for example, any one of oxygen (O), nitrogen (N) and carbon (C). In the first embodiment, a nitrogen-containing gas such as ammonia ($NH_3$) gas is used as the second element-containing gas.

A second gas supply system 244 (also referred to as a nitrogen-containing gas supply system) is constituted by the second gas supply pipe 244a, the mass flow controller 244c and the valve 244d.

Third Gas Supply System

A third gas source 245b, a mass flow controller (MFC) 245c serving as a flow rate controller (flow rate control unit) and a valve 245d serving as an opening/closing valve are installed in order at the third gas supply pipe 245a.

The third gas source 245b is the source of the inert gas. The inert gas may be used to purge the inner atmosphere of the process chamber. In the first embodiment, for example, nitrogen ($N_2$) gas is used as the third gas.

The third gas supply system 245 is constituted by the third gas supply pipe 245a, the mass flow controller 245c and the valve 245d.

One of the first gas supply system and the second gas supply system, or both, are referred to as process gas supply unit. The process gas supply unit may further include a third gas supply system.

Exhaust System

The exhaust system for exhausting the inner atmosphere of the vessel 202 includes a plurality of exhaust pipes connected to the vessel 202. That is, the exhaust system includes an exhaust pipe (first exhaust pipe) 262 connected to the process space 205 and an exhaust pipe (second exhaust pipe) 261 connected to the transfer space 206. An exhaust pipe (third exhaust pipe) 263 is connected to the downstream side of the exhaust pipes 261 and 262.

The exhaust pipe 261 is connected to the side portion or the bottom portion of the transfer space 206. A pump (Turbo Molecular Pump) 264 is provided in the exhaust pipe 261. A valve 265, which is a first exhaust valve for the transfer space, is provided at the upstream side of the pump 264 at the exhaust pipe 261.

The exhaust pipe 262 is connected to the side portion of the process space 205. An APC (Automatic Pressure Controller) 266, which is a pressure controller, is provided in the exhaust pipe 262 to adjust the inner pressure of the process space 205 to a predetermined pressure. The APC 266 includes an adjustable valve body (not shown). The APC 266 is configured to adjust the conductance of the exhaust pipe 262 in response to an instruction from the controller 280. Valve 267 is provided at the upstream side of APC 266 at exhaust pipe 262. The exhaust pipe 262, valve 267 and APC 266 are collectively referred to as a process chamber exhaust system.

A DP (Dry Pump) 269 is installed in the exhaust pipe 264. As shown in FIG. 2, the exhaust pipe 262 and the exhaust pipe 261 are connected to the exhaust pipe 264 in order from the upstream side to the downstream side of the exhaust pipe 264. The DP 269 is provided on the exhaust pipe 264 at the downstream side of the portion where the exhaust pipe 262 and the exhaust pipe 261 are connected. The DP 269 may be configured to exhaust the inner atmospheres of the process space 205 and the transfer space 206 through the exhaust pipe 262 and the exhaust pipe 261, respectively.

Controller

Next, the controller 280 of the substrate processing apparatus 100 will be described the with reference to FIG. 5. The substrate processing apparatus 100 includes the controller 280 configured to control components thereof.

Figure 5:
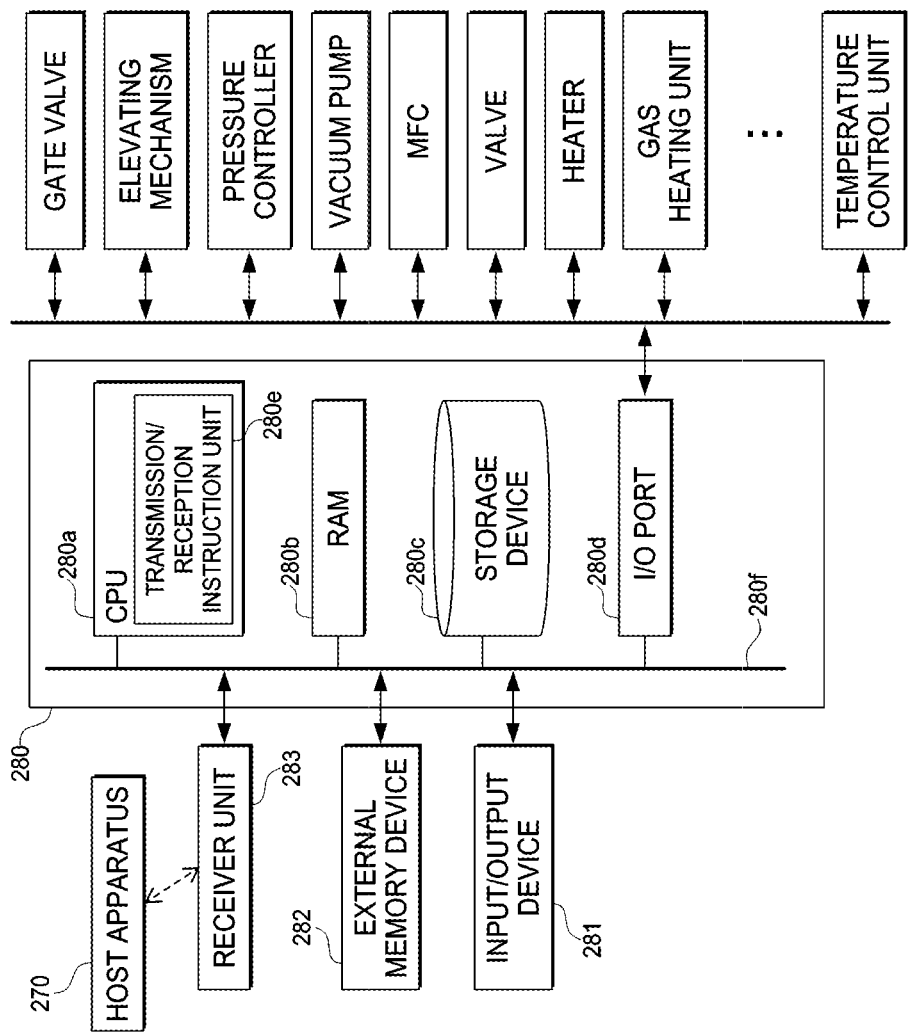
FIG. 5 schematically illustrates a configuration of a controller of the substrate processing apparatus and peripherals thereof according to the first embodiment.

FIG. 5 schematically illustrates the configuration of the controller 280. The controller 280, which is the control unit, may be embodied by a computer having a CPU (Central Processing Unit) 268a, a RAM (Random Access Memory) 280b, a storage device 280c and an I/O port 280d. The RAM 280b, the storage device 280c and the I/O port 280d may exchange data with the CPU 280a via an internal bus 280f. The transmission and the reception of data in the substrate processing apparatus 100 is performed according an instruction of a transmission/reception instruction unit 280e, which is a part of the CPU 280a.

An input/output device 281 such as a touch panel and an external memory device 282 may be connected to the controller 280. Also, a receiving unit 283 is installed which is electrically connected to a host apparatus 270 through a network.

The storage device 280c may be embodied by components such as flash memory and HDD (Hard Disk Drive). A control program for controlling the operation of the substrate processing apparatus and a program recipe in which information such as the order and condition of the substrate processing is stored are readably stored in the storage device 280c. A process recipe is a program that is executed in the controller 280 to obtain a predetermined result by performing sequences of the substrate processing. Hereinafter, the program recipe, the process recipe and the control program are collectively referred to simply as a program. The term "program" may refer to only the program recipe, only the control program, or both. The RAM 280b is a work area in which the program or the data read by the CPU 280a are temporarily stored.

The I/O port 280d is connected to the components of the substrate processing apparatus 100, such as the gate valve 209, the elevating mechanism 218, the heating unit 213 and the gas heating unit 225.

The CPU 280a is configured to read and execute the control program stored in the storage device 280c, and read the process recipe in accordance with an instruction such as an operation command inputted from the input/output device 281. The CPU 280a may be configured to control operations such as opening and closing operations of the gate valve 209, lifting operations of the elevating mechanism 218, ON/OFF operations of the pumps 264 and 269, flow rate adjusting operations of the MFCS 243c, 244c and 245c, operations of the valves 223, 243d, 244d, 245d, 265 and 267. A plurality of process recipe may be provided for substrate processing. For example, a first recipe for forming a SiO film on the substrate 200 and a second recipe for forming a SiN film on the substrate 200 are provided. These recipes are read out upon receipt of an instruction to perform the substrate processing from the host device 270.

The controller 280 may be embodied by a dedicated computer or a general purpose computer. The controller 280 of the embodiment may be embodied by preparing the external memory device 282 (e.g. magnetic disks such as hard disk, optical disks such as DVD, magneto-optical disks such as MO, and semiconductor memories such as USB memory) and installing the program on the general purpose computer using the external memory device 282. The method of providing the program to the computer is not limited to the external memory device 282. The program may be directly provided to the computer using a communication means such as a network (Internet or dedicated line) without the external memory device 282. The storage device 280c or the external memory device 282 may be embodied by a computer-readable recording medium. Hereinafter, the storage device 280c or the external memory device 282 may be collectively referred to as recording medium. Hereinafter, the term "recording medium" may refer to only the storage device 280c, only the external memory device 282, or both.

(2) Substrate Processing

Figure 6:
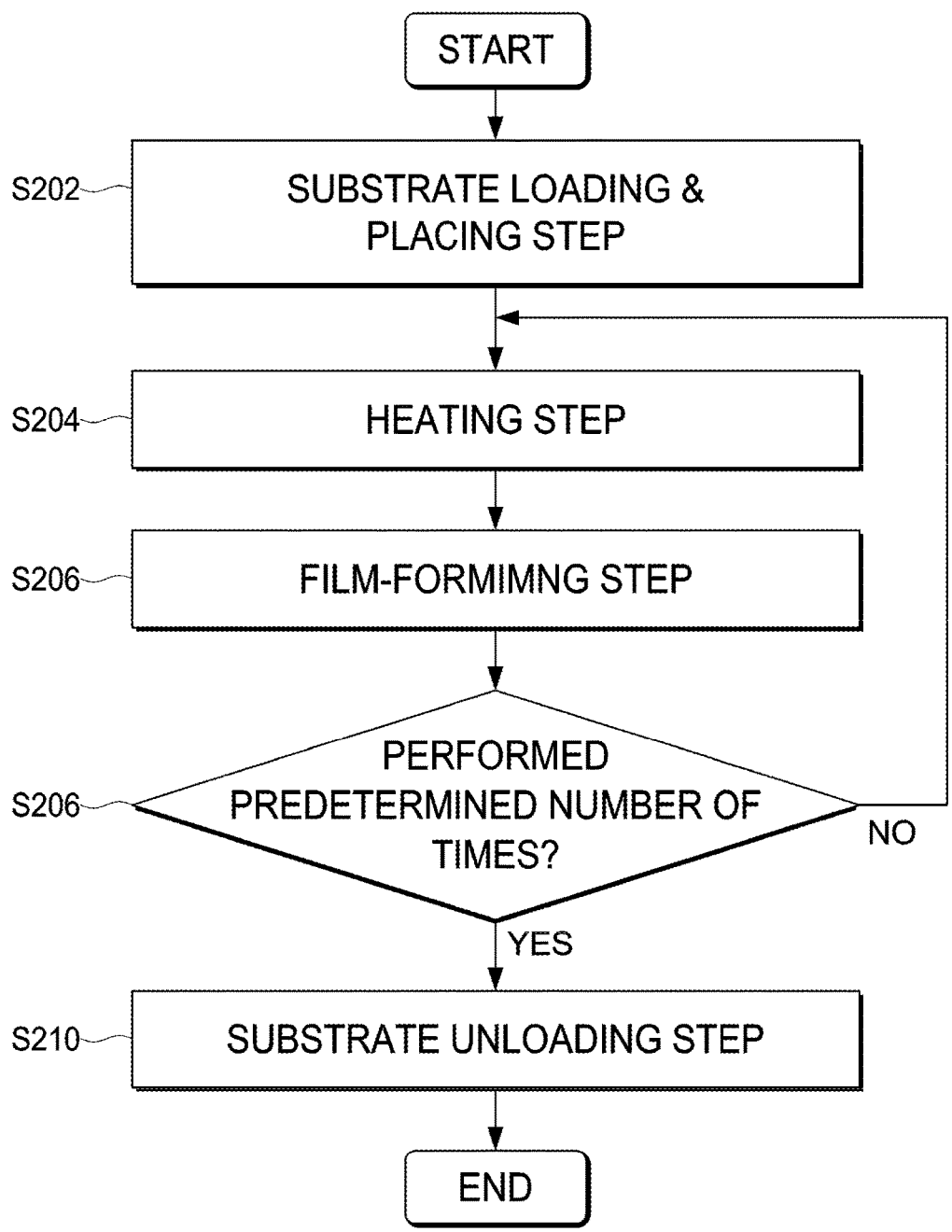
FIG. 6 is a flowchart illustrating a substrate processing according to the first embodiment.

Hereinafter, a substrate processing for forming a film on the substrate 200 using the substrate processing apparatus 100 will be described with reference to FIG. 6. FIG. 6 is a flowchart illustrating the substrate processing according to the first embodiment.

The substrate processing will be described by way of an example wherein a titanium nitride thin film is formed in the pattern region 200b using $TiCl_4$ gas as the first element-containing gas and ammonia ($NH_3$) gas as the second element-containing gas. The titanium nitride film is used as a hard mask.

Substrate Loading & Placing Step S202

A substrate loading and placing step S202 will be described. The substrate support 212 of the substrate processing apparatus 100 is lowered to the transfer position of the substrate 200 and the lift pins 207 penetrate the through-hole 214 in the substrate support 212. As a result, the lift pins 207 protrude a predetermined height from the surface of the substrate support 212. Next, the gate valve 209 is opened and the substrate 200 is loaded into the process chamber 205 and placed on the lift pins 207 by a substrate transfer device (not shown). The substrate 200 is thereby supported in horizontal posture by the lift pins 207 protruding from the surface of the substrate support 212.

After the substrate 200 is loaded into the vessel 202, the substrate transfer device is retracted out of the processing vessel 202 and the gate valve 209 is closed to seal the vessel 202. The substrate support 212 is then elevated to place the substrate 200 on the buffer structure 211 provided in the substrate support 212. When the substrate 200 is placed on the buffer structure 211, the back surface 200e is supported by the protruding portion 211a.

Heating Step S204

After the substrate 200 is placed on the substrate support 212, power is supplied to the heating unit 213 embedded in the substrate support 212. Preferably, the hot gas is supplied via the hot gas supply pipe 220 and the temperature of the substrate 200 or the surface thereof is adjusted to a predetermined temperature. For example, the temperature of the substrate 200 ranges from room temperature to 500° C., preferably from room temperature to 400° C. The temperature of the substrate 200 is adjusted by controlling the energization state of the heating unit 213 or the amount of the supplied hot gas based on the temperature detected by the temperature sensor (not shown).

The substrate support 212 is then elevated until the substrate 200 reaches the substrate processing position in the process space 205.

After the substrate 200 reaches the substrate processing position in the process space 205, the inner pressure of the process space 205 is adjusted to a predetermined pressure (for example, a high vacuum of $10^{-5}$ Pa to $10^{-1}$ Pa) by adjusting the conductance of the exhaust pipe 262 by the APC 266 and controlling the exhaust of the process space 205 by the DP 269.

The temperature of the surface of the substrate 200 is adjusted to the predetermined temperature by supplying the hot gas to the space 211b via the hot gas supply pipe 220. For example, the temperature of the surface of the substrate 200 ranges from room temperature to 500° C., preferably from room temperature to 400° C.

Film-Forming Step S206

After the heating step S204 is performed, a film-forming step S206 is performed. In the film-forming step S206, the first gas supply system and the second gas supply system are controlled to supply gases into the process space 205 according to the process recipe while the exhaust system is controlled to exhaust the process space 205 according to the process recipe. As a result, a hard mask is formed on the substrate 200, in particular in the pattern region 200b. The film-forming step S206 may include, for example, a CVD process for simultaneously supplying the first gas and the second gas into the process space and a cyclic process for alternately supplying the first gas and the second gas.

Determination Step S208 and Substrate Unloading Step S210

In a determination step S208, it is determined whether a cycle including the heating step S204 and the film-forming step S206 has been performed a predetermined number of times. If it is determined that the cycle has been performed the predetermined number of times ("YES" in FIG. 6), the substrate processing is ended and a substrate unloading step S210 is performed. In the substrate unloading step S206, the processed substrate 200 is unloaded from the vessel 202 in an order reverse to the order in the step S202. After the processed substrate 200 is unloaded, a new and unprocessed substrate in standby is loaded into the vessel 202 and subjected to the cycle including the heating step S204 and the film-forming step S206. If it is determined that the cycle has not been performed the predetermined number of times ("NO" in FIG. 6), the heating step S204 and the film-forming step S206 are performed again.

Second Embodiment

Figure 7:
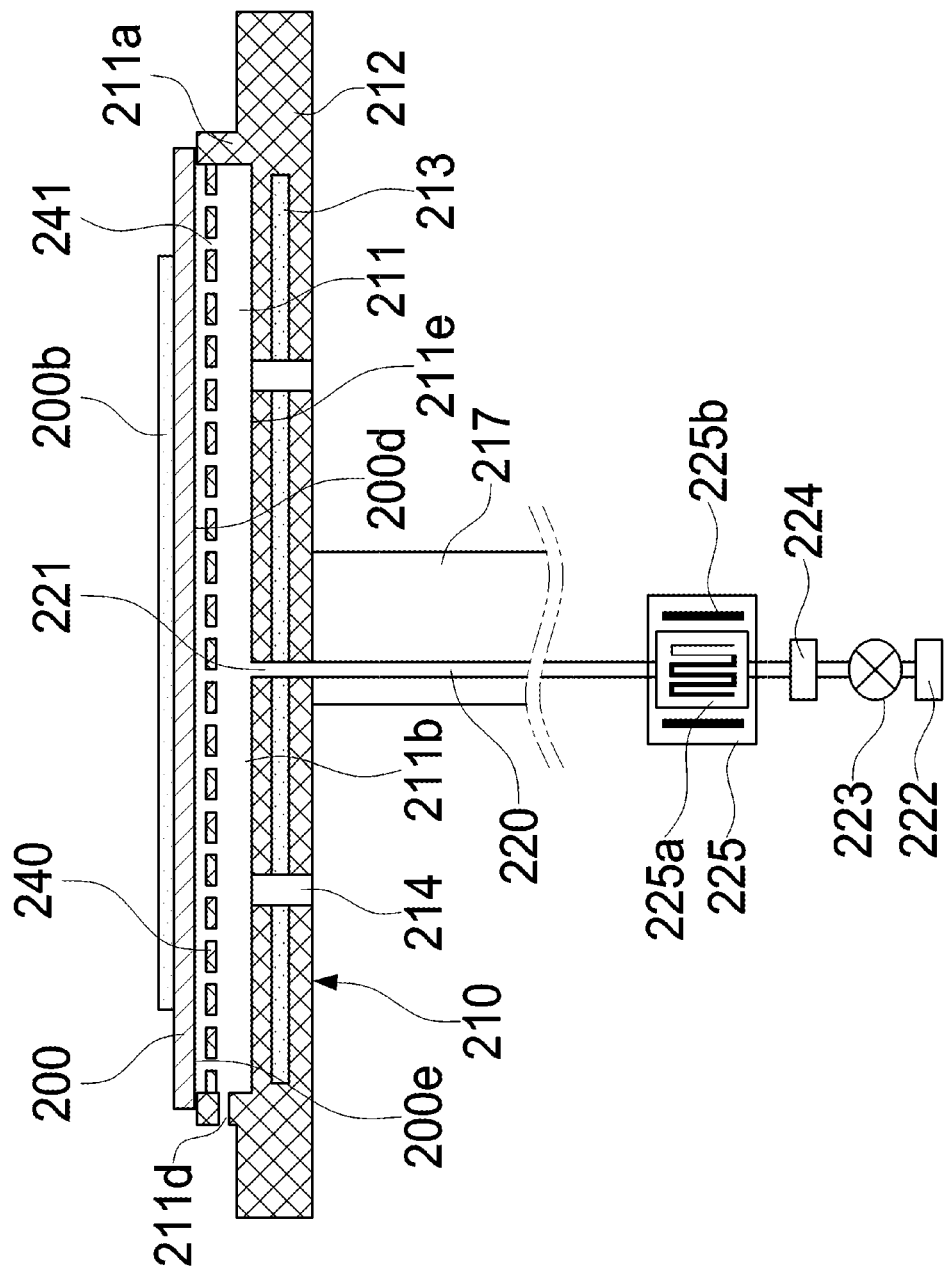
FIG. 7 schematically illustrates a vertical cross-section of a substrate support of a substrate processing apparatus according to a second embodiment described herein.

Hereinafter, the second embodiment will be described with reference to the FIG. 7. The second embodiment is different from the first embodiment in that the substrate support 212 has a different structure. The second embodiment will be described by focusing on the differences.

Compared to the substrate support 212 of the first embodiment, the substrate support 212 according to the second embodiment further includes a dispersion plate 240. The dispersion plate 240 is installed to be parallel to the back surface of the substrate 200. For example, as shown in FIG. 7, the dispersion plate 240 is fixed to the side surface of the protruding portion 211a. That is, the dispersion plate 240 is installed between the substrate 200 and the bottom portion 211e. The dispersion plate 240 has dispersion holes 241. The dispersion holes 241 are provided to face the back surfaces 200d and 200e. The dispersion plate 240 is spaced apart from the back surface of the substrate by a predetermined distance and is above the holes 211d.

According to the second embodiment, the hot gas supplied through the hot gas supply port 221 is guided by the dispersion plate 240 to uniformly collide with the back surfaces 200d and 200e. Thus, the surface of the substrate 200 and the pattern region 200b are uniformly heated.

Preferably, the dispersion plate 240 may be provided directly above the hot gas supply port 221 to uniformly disperse into the space 211b the hot gas that collided with the dispersion plate 240. The substrate 200 may be uniformly heated since the hot gas contacts the back surface of the substrate 200 at an equal pressure.

If the dispersion plate 240 is not provided above the hot gas supply port 221, the hot gas directly collides with the back surface of the substrate 200. Therefore, the temperature of the portion of the back surface of the substrate 200 that directly is in direct contact with the hot gas may be locally elevated. When the dispersion plate 240 is installed directly above the hot gas supply port 221, the local elevation of the temperature of the back surface of the substrate 200 may be prevented.

Third Embodiment

Figure 8:
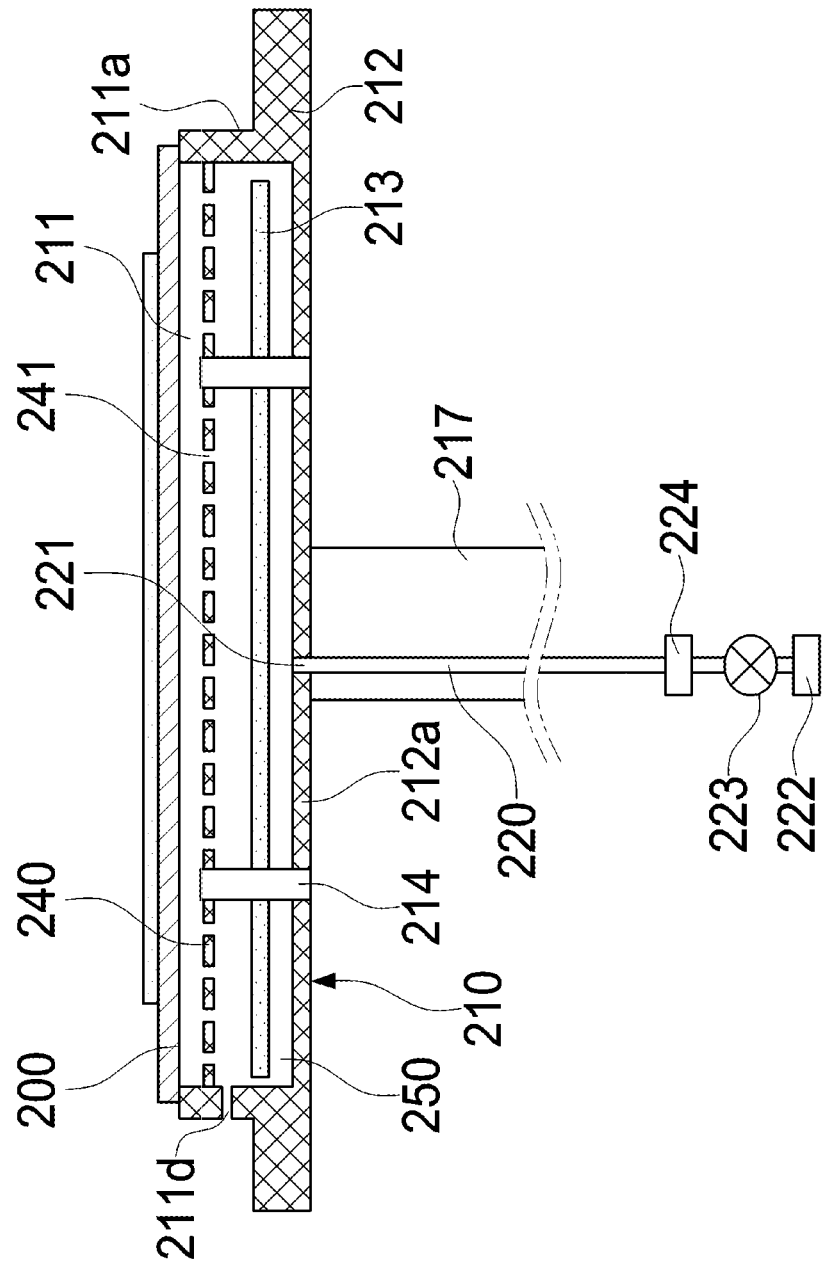
FIG. 8 schematically illustrates a vertical cross-section of a substrate support of a substrate processing apparatus according to a third embodiment described herein.

Hereinafter, the third embodiment will be described with reference to the FIG. 8. The third embodiment is different from the first embodiment in that the substrate support 212 has a different structure. The third embodiment will be described by focusing on the differences.

Compared to the substrate support 212 of the first embodiment, the substrate support 212 according to the third embodiment does not include the gas heating unit 225. Instead, the substrate support 212 according to the third embodiment includes a space 250 in which the inert gas is diffused and heated around the heating unit 213 and an inert gas supply port (not shown) connected to a bottom 250 of the substrate support 212 defining the space 250.

When the substrate 200 is processed, the inert gas is supplied from the gas source 222 into the space 250. The inert gas supplied into the space 250 is diffused in the space 250 and heated by the heating unit 213. The heated inert gas comes in contact with the back surface of the substrate 200 through the dispersion holes 241 of the dispersion plate 240 and heats the substrate 200.

According to the third embodiment, the separate gas heating unit 225 is not necessary contrary to the first embodiment. Therefore, according to the third embodiment, the manufacturing of the substrate processing apparatus is facilitated.

Other Embodiments

While the technique is described in detail by way of the above-described embodiments, the above-described technique is not limited thereto. The above-described technique may be modified in various ways without departing from the scope of the disclosure.

For example, according to the above-described embodiments, $TiCl_4$ gas is used as the first element-containing gas and $NH_3$ gas as the second element-containing gas in the film-forming process performed in the substrate processing apparatus, and TiN film is formed on the substrate 200 as the hard mask. However, the above-described technique is not limited thereto. The above-described technique may also be applied to a formation of a hard mask having etch selectivity to the substrate 200a. The hard mask having etch selectivity to the substrate 200a may include a metal such as chromium and molybdenum, or an oxide or nitride thereof.

While the technique is exemplarily described by way of a formation of a hard mask, the above-described technique is not limited thereto. For example, the above-described technique may be applied to a heating process performed in a formation process of the L-template. The above-mentioned procedure may also be applied to a film-forming process for repairing defects in the L-template.

According to the technique described herein, the generation of particles may be suppressed.

What is claimed is:

1. A substrate processing apparatus comprising:
a substrate support comprising:
a ring-shaped protruding portion supporting a substrate including a pattern region at a center thereof and a non-contacting region at a periphery thereof; and
a bottom portion defining a space along with the ring-shaped protruding portion;
a process chamber wherein the substrate support is provided and the substrate is processed;
a process gas supply unit configured to supply a process gas into the process chamber; and
a hot gas supply unit configured to heat and supply an inert gas into the space; and
at least one hole penetrating a side surface of the ring-shaped protruding portion.

2. The substrate processing apparatus of claim 1, wherein the hot gas supply unit comprises: a supply pipe connected to the bottom portion; and a heating unit installed at the supply pipe and configured to heat the inert gas in the supply pipe.

3. The substrate processing apparatus of claim 2, wherein the space is provided at least below a back surface of the pattern region and a back surface of the non-contacting region.

4. The substrate processing apparatus of claim 3, further comprising a dispersion plate disposed between an upper end of the ring-shaped protruding portion and the bottom portion.

5. The substrate processing apparatus of claim 4, wherein the dispersion plate is parallel to the substrate.

6. The substrate processing apparatus of claim 2, further comprising a dispersion plate disposed between an upper end of the ring-shaped protruding portion and the bottom portion.

7. The substrate processing apparatus of claim 6, wherein the dispersion plate is parallel to the substrate.

8. The substrate processing apparatus of claim 1, wherein the space is provided at least below a back surface of the pattern region and a back surface of the non-contacting region.

9. The substrate processing apparatus of claim 8, further comprising a dispersion plate disposed between an upper end of the ring-shaped protruding portion and the bottom portion.

10. The substrate processing apparatus of claim 9, wherein the dispersion plate is parallel to the substrate.

11. The substrate processing apparatus of claim 8, further comprising a dispersion plate disposed between an upper end of the ring-shaped protruding portion and the bottom portion.

12. The substrate processing apparatus of claim 11, wherein the dispersion plate is parallel to the substrate.

\* \* \* \* \*